United States Patent [19]

Kennedy et al.

[11] Patent Number: 4,972,353

[45] Date of Patent: Nov. 20, 1990

[54] RADIO-FREQUENCY TRANSFORMER PROVIDING AUTOMATIC GAIN CONTROL AND OVERLOAD PROTECTION

[75] Inventors: John F. Kennedy, Garden City, Mich.; Ralph S. Hashoian, Brookfield, Wis.

[73] Assignee: Ford Motor Company, Dearborn, Mich.

[21] Appl. No.: 312,162

[22] Filed: Feb. 21, 1989

[51] Int. Cl.⁵ .............................................. H04B 1/16
[52] U.S. Cl. .................................. 455/234; 455/193; 455/240
[58] Field of Search ...................... 455/193, 234, 240

[56] References Cited

U.S. PATENT DOCUMENTS

| | | | |
|---|---|---|---|
| 1,790,171 | 1/1931 | Slepian | 330/8 |
| 2,615,977 | 10/1952 | Sziklai et al. | 455/234 |
| 3,210,650 | 10/1965 | Barnes | 330/8 |
| 3,359,501 | 12/1967 | Troutman | 330/8 |
| 4,088,942 | 5/1978 | Miko | 323/308 |
| 4,419,723 | 12/1983 | Wilson, Jr. | 363/21 |
| 4,473,811 | 9/1984 | Schauble | 336/171 |
| 4,562,382 | 12/1985 | Elliott | 315/205 |
| 4,682,126 | 7/1987 | Milberger et al. | 333/1.1 |

FOREIGN PATENT DOCUMENTS

| | | | |
|---|---|---|---|
| 0140442 | 10/1979 | Japan | 455/234 |
| 0064930 | 4/1984 | Japan | 455/234 |

Primary Examiner—Joseph A. Orsino
Assistant Examiner—J. Jackson
Attorney, Agent, or Firm—Mark Mollon; Paul K. Godwin

[57] ABSTRACT

A composite core transformer has a high permeability segment and a low permeability segment such that a saturable portion of the core is used to control RF energy coupled from a receiving antenna to a radio receiver. Transformer input and output windings are wound on the low permeability segment of the composite core. A control winding is wound on the high permeability segment of the core and receives an automatic gain control signal from a radio receiver. The resulting radio receiver has high resistance to overload and an extended dynamic range of automatic gain control.

14 Claims, 2 Drawing Sheets

RADIO-FREQUENCY TRANSFORMER PROVIDING AUTOMATIC GAIN CONTROL AND OVERLOAD PROTECTION

BACKGROUND OF THE INVENTION

The present invention relates, in general, to a transformer for coupling RF energy from an antenna to a receiver and, more specifically, to a composite transformer having input and output windings and a magnetizing loop winding for controlling coupling between the input and output windings.

Broadcast radio receivers, such as the superheterodyne receiver, typically include an antenna connected to a radio frequency (RF) amplifier followed by intermediate frequency (IF) stages, a detector, an audio amplifier, and an audio output transducer. Nearly all radio receivers employ automatic gain control (AGC) in their RF amplifier and IF amplifier stages. The use of AGC ensures that an amplifier output remains at nearly a constant level in spite of variations in the strength of incoming signals.

The control voltage for AGC action is normally derived from the detector stage of the receiver. The AGC voltage is a DC voltage which is determined by the strength of the received carrier signal and is used to inversely affect the gain factor of the associated RF or IF amplifier. As a result of automatic gain control, the average input signal power to the audio amplifier stage has a constant level although receiver motion and external conditions may cause variations in received RF signal strength.

Although the RF amplifier of a typical receiver is responsive to input signals over a range of magnitudes, it is fairly easy to overload the RF amplifier. For example, a typical RF amplifier can be overloaded by an antenna signal strength of as little as 50 millivolts. The overloaded amplifier becomes nonlinear, thus introducing harmonic distortion.

SUMMARY OF THE INVENTION

Accordingly, it is a principal object of the present invention to provide apparatus and a method for coupling RF energy from an antenna to a radio receiver having improved dynamic range.

It is a further object of the invention to improve the automatic gain control of a radio receiver.

It is another object of the invention to avoid overload of an RF receiver.

These and other objects are achieved by means of an RF transformer for coupling RF energy from an antenna to an RF input stage comprising a composite magnetic core, input and output windings, and a control winding. The composite magnetic core has at least one segment of a first permeability material and at least one segment of a second permeability material having a higher permeability than the first permeability material. The composite core defines a closed magnetic circuit. The input and output windings are wound on the first permeability material. The control winding is wound on the second permeability material for magnetizing the composite core according to a current supplied to the control winding. The coupling of RF energy between the input winding and output winding is controlled by the magnitude of the control winding current. In one embodiment, the transformer preferably includes a shorting ring disposed between the input winding and the output winding.

The transformer structure of the present invention provides a controllable dynamic loss between the input and output windings of the transformer. Thus, an AGC signal coupled to the control winding affects an automatic gain control of RF energy input to a radio receiver. Energy transfer between the input and output windings is affected by a change in magnetic coupling between input and output windings due to the magnetizing current and by the variable impedance of the input winding which causes the efficiency of transferring energy from the antenna into the transformer to be varied.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

DETAILED DESCRIPTION OF THE PREFERRED EMBODIMENTS

Figure 1:
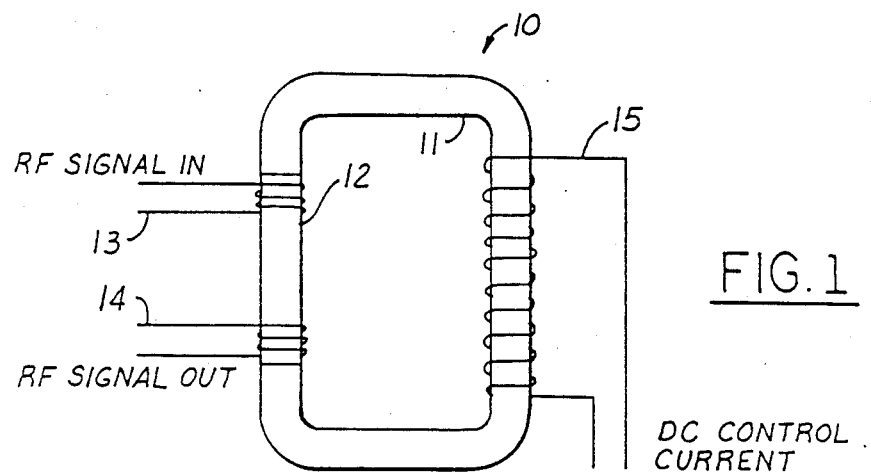
FIG. 1 is a plan view of a first, generalized embodiment of the present invention.

The present invention provides a controllable dynamic loss between an RF antenna and the RF input of a radio receiver without introducing a large insertion loss. A transformer is selected as the control element in order to maintain circuit linearity and avoid harmonic distortion. Referring to FIG. 1, a composite core transformer 10 generally useful in the practice of the invention, and particularly useful in the AM frequency band, includes a high permeability core segment 11 and a lower permeablity core segment 12. The composite core forms a closed magnetic circuit with segment 11 taking the form of a "C" and with segment 12 taking the form of a rod, although other configurations are possible (e.g., an E-I core) and will be apparent to those skilled in the art.

A first winding 13 and a second winding 14 are wound on low permeability core segment 12. Coil 13 is shown as an input winding and coil 14 is shown as an output winding, although the input and output could be reversed. A control winding 15 is wound on high permeability core segment 11 in order to provide magnetization of low permeability segment 12 in response to a DC control current flowing in control winding 15.

A ferrite material is a preferred material for low permeability core segment 12, although other magnetic materials such as laminated steel can be employed. The preferred material for high permeability segment 11 is laminated steel, preferably iron steel.

In the absence of current flow in control winding 15, RF signals coupled to input winding 13 are transferred through low permeability segment 12 to output winding 14 with minimum loss. Energization of control winding 15 with a DC control current reduces the amount of RF energy transferred from input winding 13 to output winding 14 as follows. Current in control winding 15 creates a magnetic field in segment 11 which creates flux in segment 12 that reduces the magnetic coupling coefficient between windings 13 and 14. Such a reduced magnetic coupling coefficient results in a reduction of signal coupled between the input and output windings. Thus, the coupling of energy between input winding 13 and output winding 14 is determined by the magnitude of control winding current. Simultaneously, the magnetizing of the composite core by control winding current changes the impedance (i.e., self-inductance) of input winding 13 since inductance is proportional to the effective permeability of the core. This change of input impendance causes a decoupling between the antenna and the transformer such that the efficiency of energy transfer from the antenna to the transformer is reduced. By virtue of these mechanisms, the transformer of the present invention is able to provide a controllable dynamic loss of up to more than 30 dB.

In order to achieve low insertion loss (i.e., minimal signal loss when there is no AGC control current) with the transformer of the present invention, it is desirable to electrically (i.e., capacitively) isolate the input and output lead wires to the windings. For example, the wires can be shielded by ferrite material. The input and output windings themselves should be kept close together without introducing any avoidable capacitive coupling.

Figure 2:
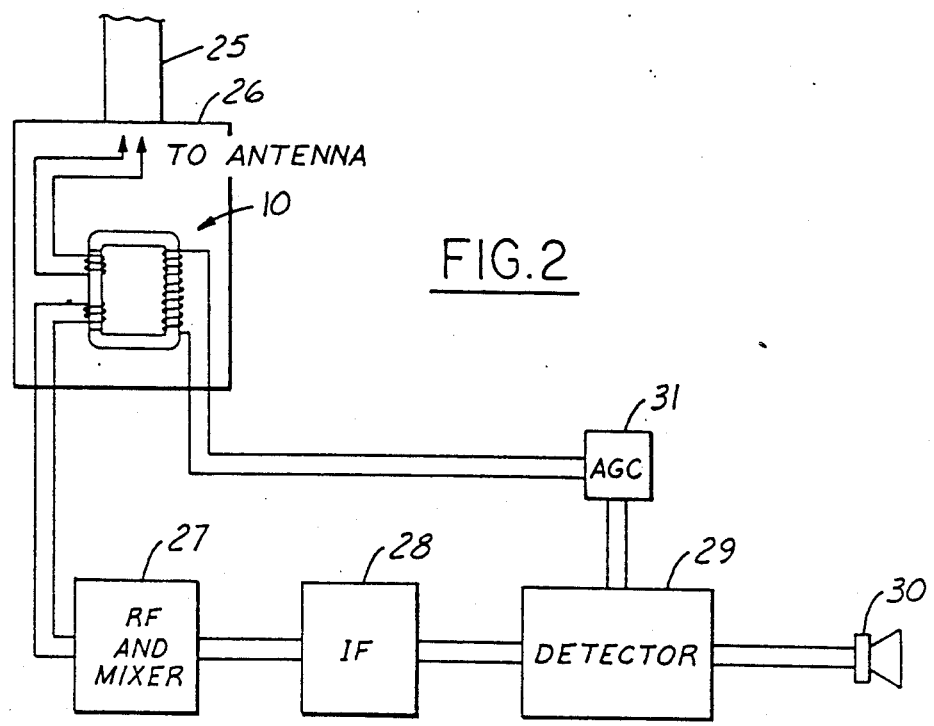
FIG. 2 is a schematic/block diagram of a radio receiver system according to the present invention.

A schematic/block diagram including portions of a radio receiving system including automatic gain control is shown in FIG. 2. An antenna 25 receives RF signals transmitted by a broadcast station. Antenna 25 is mounted on an insulated base 26. Transformer 10, as described with ference to FIG. 1, is located within antenna base 26. Input leads from transformer 10 are connected to antenna 25 in a conventional manner. Output leads are connected to a radio tuning section including an RF amplifier and mixer stage 27. Intermediate frequency signals from the mixer are provided to an IF amplifier stage 28. IF signals are then demodulated in a detector 29 which drives an output transducer or speaker 30 through an audio amplifier (not shown).

An AGC circuit 31 is also connected to detector 29. AGC circuit 31 is also connected to the control winding of transformer 10. AGC circuit 31 determines the carrier signal strength of the received broadcast and generates an AGC control signal. The control signal is fed back to the control winding on transformer 10 and causes the RF energy supplied to RF amplifier and mixer stage 27 to be maintained at a substantially constant level. AGC circuit 31 can be comprised of a low pass filter for recovering the DC offset in the demodulated signal which corresponds to the received carrier strength, for example.

While transformer 10 may conveniently be located within antenna base 26, it is also feasible to locate the transformer with the remaining receiver hardware, remote from the antenna.

Figure 3:
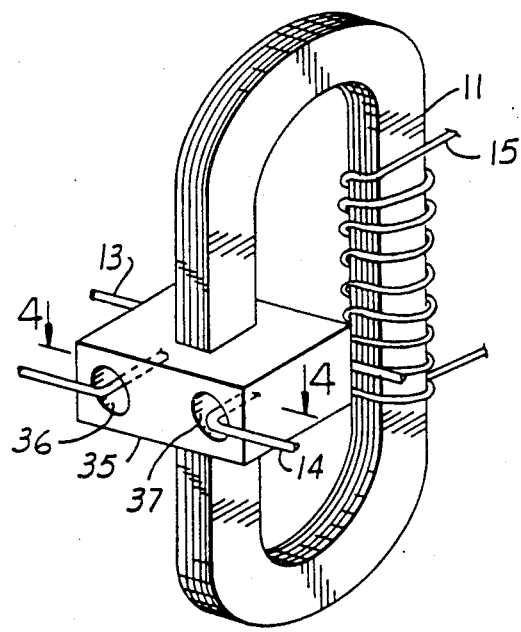
FIG. 3 is a perspective view of an alternative embodiment of the transformer of the present invention adapted for FM operation.

Turning now to FIG. 3, an alterative embodiment of the transformer of the present invention is shown which is adapted for use with higher frequencies such as in the FM broadcast band from 88.1 megahertz to 107.9 megahertz. As in the previous embodiment, a laminated steel, high permeability core segment 11 receiving a control winding 15 is employed. In this embodiment, however, a balun core 35 is interposed into the magnetic circuit as the low permeability core segment of the transformer. Balun core 35 is preferably comprised of low permeability powdered iron and includes a pair of parallel bores 36 and 37 which receive input winding 13 and output winding 14, respectively. The input and output windings are shown as single turn windings in this embodiment. As in the previous embodiment, current provided to control winding 15 controls the saturation of the low permeability balun core 35 and consequently the transfer of RF energy into input winding 13 from the antenna and between input winding 13 and output winding 14.

Figure 4:
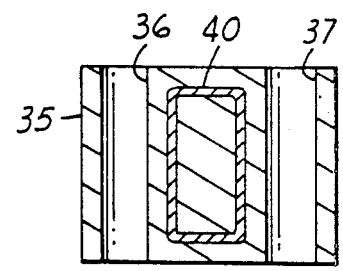
FIG. 4 is a horizontal cross-sectional view of the balun core along line 4—4 of FIG. 3.

Balun core 35 preferably includes a shorting ring 40 as shown in FIG. 4 which is a horizontal cross section through balun core 35. Shorting ring 40 is a loop of electrically conducting material embedded in the magnetic material of balun core 35. The multiple magnetic coupling between input winding and shorting ring and between shorting ring and output winding increases the influence of the bias magnetic field generated by the control current on the magnetic coupling between the input and output windings.

Figure 5:
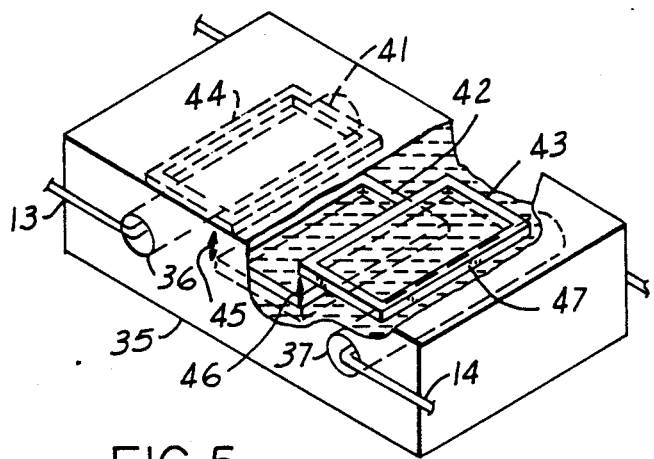
FIG. 5 is a perspective view of an alternative embodiment of the balun core showing a plurality of shorting rings in phantom.
Figure 6:
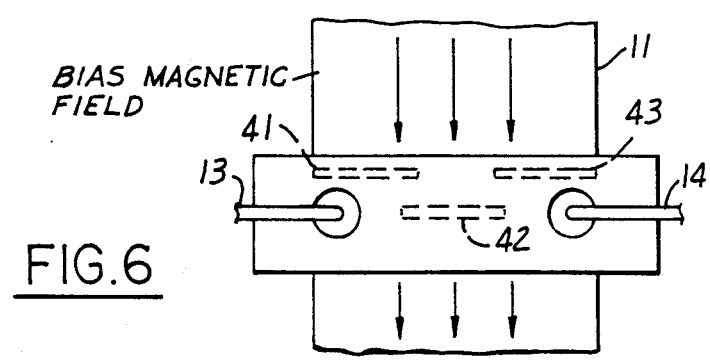
FIG. 6 is an end view of the balun core of FIG. 5.

The benefits derived from shorting ring 40 can be increased by increasing the number of shorting rings as shown in FIGS. 5 and 6. Shorting rings 41, 42, and 43 are staggered between input windings 13 and 14. Energy from winding 13 is coupled to a leg 44 of shorting ring 41. The energy transfers to shorting ring 42 at gap 45 and to shorting ring 43 at gap 46. The energy finally reaches output winding 14 from a leg 47 of shorting ring 43.

Although dependent upon specific materials and dimensions employed, input and output windings can typically include from one to four turns. Control winding 15 may typically include in either embodiment from 200 to 1000 turns so that it can saturate the lower permeability segment of the composite core.

Further modification of the performance of the present invention can be achieved by employing external capacitors coupled to the windings in various ways. Such capacitors can alter the resonant characteristics between the antenna and the input winding in response to magnetization of the composite core.

The foregoing invention provides a controllable dynamic loss of signal coupling with minimal insertion loss. Although prior art receiving equipment has been shown to be susceptible to overload when antenna signals reach 50 millivolts, use of the present invention can increase overload resistance up to about 10 volts.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A radio receiver comprising:
    an RF transformer including a composite magnetic core having at least one segment of a first permeability material and at least one segment of a second permeability material having a higher permeability than said first permeability material, an input winding wound on said first permeability material for receiving an RF input signal, an output winding wound on said first permeability material, and a control winding wound on said second permeability material for magnetizing said composite core according to a current supplied to said control winding such that coupling of said RF input signal between said input winding and said output winding is controlled by the magnitude of said control winding current; and tuning and detection means coupled to said output winding for detecting a program signal and for generating an automatic gain control signal, said automatic gain control signal being coupled to said control winding in order to provide said control winding current.

2. The receiver of claim 1 further comprising an antenna, said RF transformer being located within said antenna.

3. The radio receiver of claim 1 including a segment formed in the shape of a rod, said input winding and said output winding being wound on said rod.

4. The radio receiver of claim 1 wherein said first permeability material is comprised of ferrite.

5. The radio receiver of claim 1 wherein said first permeability material is comprised of powdered iron.

6. The radio receiver of claim 1 wherein said second permeability material is comprised of laminated steel.

7. The radio receiver of claim 1 wherein said composite core forms a closed loop.

8. The radio receiver of claim 7 wherein said composite core is substantially rectangular.

9. The radio receiver of claim 1 including a balun core in which said input winding and said output winding are disposed.

10. The radio receiver of claim 9 further comprising at least one shorting ring contained within said balun core intermediate said input winding and said output winding.

11. The receiver of claim 1 wherein said RF transformer further includes a shorting ring between said input winding and said output winding.

12. The radio receiver of claim 11 wherein said shorting ring is comprised of a closed loop of conductive material embedded in said first segment.

13. A method of controlling forward gain of RF energy through an input transformer in a radio receiver comprising the steps of:

coupling incoming RF signals between an input winding and an output winding of said transformer, said input and output windings being magnetically coupled through a low permeability material;

magnetizing said low permeability material by a controlled amount by providing a high permeability material in a magnetic circuit with said low permeability material and providing a control winding wound on said high permeability material; and energizing said control winding with a gain control current to reduce said magnetic coupling of said input and output windings and to alter the input impedance of said transformer.

14. The method of claim 13 further comprising the step of:

increasing the effect of said gain control current by providing at least one shorting ring disposed between said input winding and said output winding.

* * * * *